(12) United States Patent
Wang et al.

(10) Patent No.: US 11,973,005 B2
(45) Date of Patent: Apr. 30, 2024

(54) COPLANAR CONTROL FOR FILM-TYPE THERMAL INTERFACE

(71) Applicant: Taiwan Semiconductor Manufacturing Co., Ltd., Hsinchu (TW)

(72) Inventors: Yu-Hsun Wang, Zhubei (TW); Ping-Yin Hsieh, Hsinchu (TW); Pu Wang, Hsinchu (TW); Li-Hui Cheng, New Taipei (TW); Szu-Wei Lu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 154 days.

(21) Appl. No.: 17/392,904

(22) Filed: Aug. 3, 2021

(65) Prior Publication Data

US 2022/0359345 A1    Nov. 10, 2022

Related U.S. Application Data

(60) Provisional application No. 63/184,598, filed on May 5, 2021.

(51) Int. Cl.
| | |
|---|---|
| *H01L 25/00* | (2006.01) |
| *H01L 23/367* | (2006.01) |
| *H01L 23/433* | (2006.01) |
| *H01L 25/065* | (2023.01) |
| *H01L 23/498* | (2006.01) |
| *H01L 25/18* | (2023.01) |

(52) U.S. Cl.
CPC ........ *H01L 23/433* (2013.01); *H01L 23/3675* (2013.01); *H01L 25/0652* (2013.01); *H01L 25/0655* (2013.01); *H01L 25/50* (2013.01); *H01L 23/49833* (2013.01); *H01L 25/18* (2013.01)

(58) Field of Classification Search
CPC ............... H01L 23/433; H01L 23/3675; H01L 25/0652
See application file for complete search history.

(56) References Cited

U.S. PATENT DOCUMENTS

| | | |
|---|---|---|
| 8,993,380 B2 | 3/2015 | Hou et al. |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,461,018 B1 | 10/2016 | Tsai et al. |
| 9,472,485 B2 | 10/2016 | Saeidi et al. |

(Continued)

FOREIGN PATENT DOCUMENTS

| | | |
|---|---|---|
| TW | 201411788 A | 3/2014 |
| TW | 202010072 | 3/2020 |

*Primary Examiner* — Thao P Le
(74) *Attorney, Agent, or Firm* — Slater Matsil, LLP

(57) ABSTRACT

A method includes bonding a first package and a second package over a package component, adhering a first Thermal Interface Material (TIM) and a second TIM over the first package and the second package, respectively, dispensing an adhesive feature on the package component, and placing a heat sink over and contacting the adhesive feature. The heat sink includes a portion over the first TIM and the second TIM. The adhesive feature is then cured.

20 Claims, 17 Drawing Sheets

(56) References Cited

U.S. PATENT DOCUMENTS

| | | | |
|---|---|---|---|
| 9,496,189 B2 | 11/2016 | Yu et al. | |
| 9,666,502 B2 | 5/2017 | Chen et al. | |
| 9,735,131 B2 | 8/2017 | Su et al. | |
| 10,770,369 B2 | 9/2020 | Hung et al. | |
| 2015/0001701 A1* | 1/2015 | Li | H05K 5/03 |
| | | | 257/713 |
| 2017/0162550 A1* | 6/2017 | Das | H01L 23/5385 |
| 2018/0374776 A1 | 12/2018 | Liu et al. | |
| 2020/0294880 A1 | 9/2020 | Interrante et al. | |
| 2022/0122896 A1* | 4/2022 | Wang | H01L 25/105 |
| 2022/0359339 A1* | 11/2022 | Hsieh | H01L 23/49822 |
| 2023/0026141 A1* | 1/2023 | Chen | H01L 23/3135 |

\* cited by examiner

COPLANAR CONTROL FOR FILM-TYPE THERMAL INTERFACE

PRIORITY CLAIM AND CROSS-REFERENCE

This application claims the benefit of U.S. Provisional Application No. 63/184,598, filed on May 5, 2021, and entitled "Package Structure for TIM Coverage Improvement and Method of Forming the Same;" which application is hereby incorporated herein by reference.

BACKGROUND

Integrated circuit packages may have a plurality of package components such as device dies and package substrates bonded together to increase the functionality and integration level. Due to the differences between different materials of the plurality of package components, warpage may occur. With the increase in the size of the packages, warpage become more severe. This incurs some new problems. For example, thermal interface material may be used to conduct heat from the devices in the integrated circuit packages to heat sinks. Due to the warpage, delamination may occur between the thermal interface material and the corresponding device dies or packages. The delamination is usually found at the regions where different material/components join to each other, such as the corners of device dies or packages, and on the weakly adhered surfaces such as the surface of molding compound.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
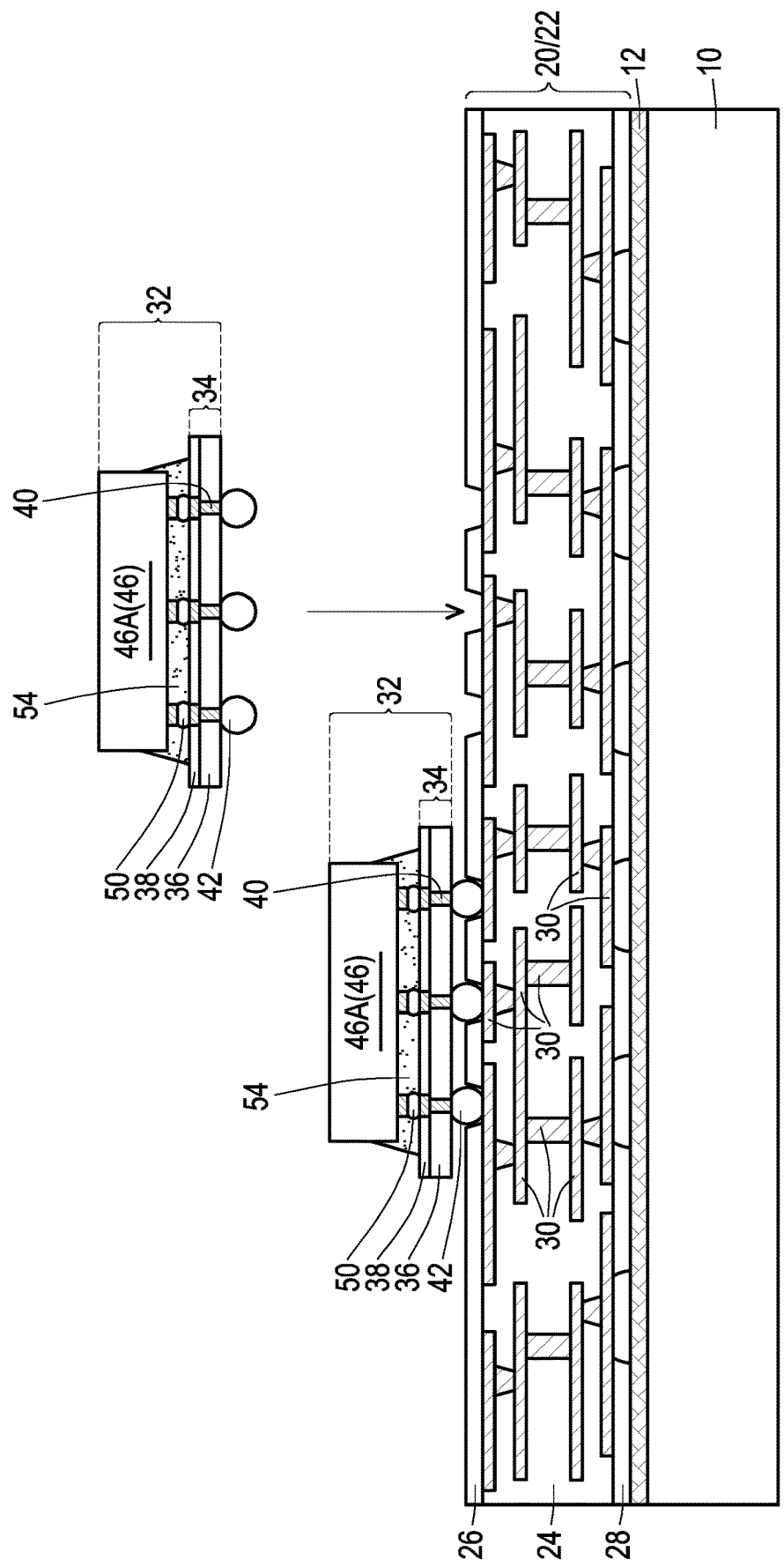
FIGS. 1-5 and 6A illustrate the cross-sectional views of intermediate stages in the formation of a package including adhesive features in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A package and the method of forming the same are provided. In accordance with some embodiments of the present disclosure, a first package component (such as a package) is bonded on a second package component (such as a package substrate). A Thermal Interface Material (TIM) is disposed on the first package component. An adhesive is also disposed over the second package component to form an adhesive feature. A heat sink, which may also be a lid, may be placed over and joined to the adhesive feature. The adhesive feature may help to reduce the warpage of the resulting package, and reduce the delamination between the TIM and the underlying first package component. Embodiments discussed herein are to provide examples to enable making or using the subject matter of this disclosure, and a person having ordinary skill in the art will readily understand modifications that can be made while remaining within contemplated scopes of different embodiments. Throughout the various views and illustrative embodiments, like reference numbers are used to designate like elements. Although method embodiments may be discussed as being performed in a particular order, other method embodiments may be performed in any logical order.

FIGS. 1-5 and 6A illustrate the cross-sectional views of intermediate stages in the formation of a package including adhesive features in accordance with some embodiments. The corresponding processes are also reflected schematically in the process flow shown in FIG. 15.

FIG. 1 illustrates a cross-sectional view of a package component 20, which includes a plurality of identical package components 22 therein. In accordance with some embodiments, package component 20 is a package substrate strip, which includes a plurality of package substrates 22 therein. Package substrates 22 may be cored package substrates including cores, or may be core-less package substrates that do not have cores therein. In accordance with alternative embodiments, package component 20 may be of another type such as an interposer wafer, a printed circuit board, a reconstructed wafer, or the like. In accordance with some embodiments, package component 20 may be free from (or may include) active devices such as transistors and diodes therein. Package component 20 may also be free from (or may include) passive devices such as capacitors, inductors, resistors, or the like therein.

In accordance with some embodiments of the present disclosure, package component 20 includes a plurality of dielectric layers, which may include dielectric layers 24, dielectric layer 26 over dielectric layers 24, and dielectric layer 28 under dielectric layers 24. In accordance with some embodiments, dielectric layers 26 and 28 may be formed of dry films such as Ajinomoto Build-up Films (ABFs). Alternatively, dielectric layers 26 and 28 may be formed of or comprise polybenzoxazole (PBO), polyimide, benzocyclobutene (BCB), or the like, which may be coated in a flowable form and then cured. Dielectric layers 24, when being in a core, may be formed of epoxy, resin, glass fiber, prepreg (which comprises epoxy, resin, and/or glass fiber), glass, molding compound, plastic, combinations thereof, and/or multi-layers thereof. In accordance with alternative embodiments, dielectric layers 24 may be formed of polymers such as PBO, polyimide, BCB, or the like. Redistribution lines 30, which include metal lines/pads and vias, are formed in dielectric layers 24. Redistribution lines 30 are interconnected to form through-connections in package component 20.

In accordance with some embodiments, when package component 20 is not rigid enough to support itself and the overlying structure, carrier 10 is provided to support package component 20. In accordance with alternative embodiments, package component 20 is thick and rigid, and is able to support the structure formed thereon. Accordingly, carrier 10 and release film 12 may not be used. Carrier 10, when used, may be a glass carrier, an organic carrier, or the like. Release film 12 is formed on carrier 10 for attaching package components to carrier 10. Release film 12 may be formed of a polymer-based material (such as a Light-To-Heat-Conversion (LTHC) material), which may comprise an epoxy-based thermal-release material.

In accordance with alternative embodiments, as shown in FIG. 1, package component 20 is pre-formed, and is placed over release film 12. In accordance with alternative embodiments, package component 20 is built layer-by-layer on top of release film 12. For example, a blanket dielectric layer 28 may be formed on release film 12, followed by the formation of dielectric layers 24 and 26 and redistribution lines (RDLs) 30 layer-by-layer. The corresponding dielectric layers 24, 26, and/or 28 may be formed of organic materials (for example, polymers) such as polyimide, PBO, or the like. In accordance with alternative embodiments of the present disclosure, dielectric layers 24, 26, and/or 28 may be formed of inorganic dielectric materials such as silicon nitride, silicon oxide, silicon oxynitride, or the like, which may be deposited. The deposition process may include Chemical Vapor Deposition (CVD), Atomic Layer Deposition (ALD), Plasma-Enhanced Chemical Vapor Deposition (PECVD), or other applicable deposition processes. RDLs/pads 30 may be formed through plating, or alternatively, through damascene processes.

Figure 6A:
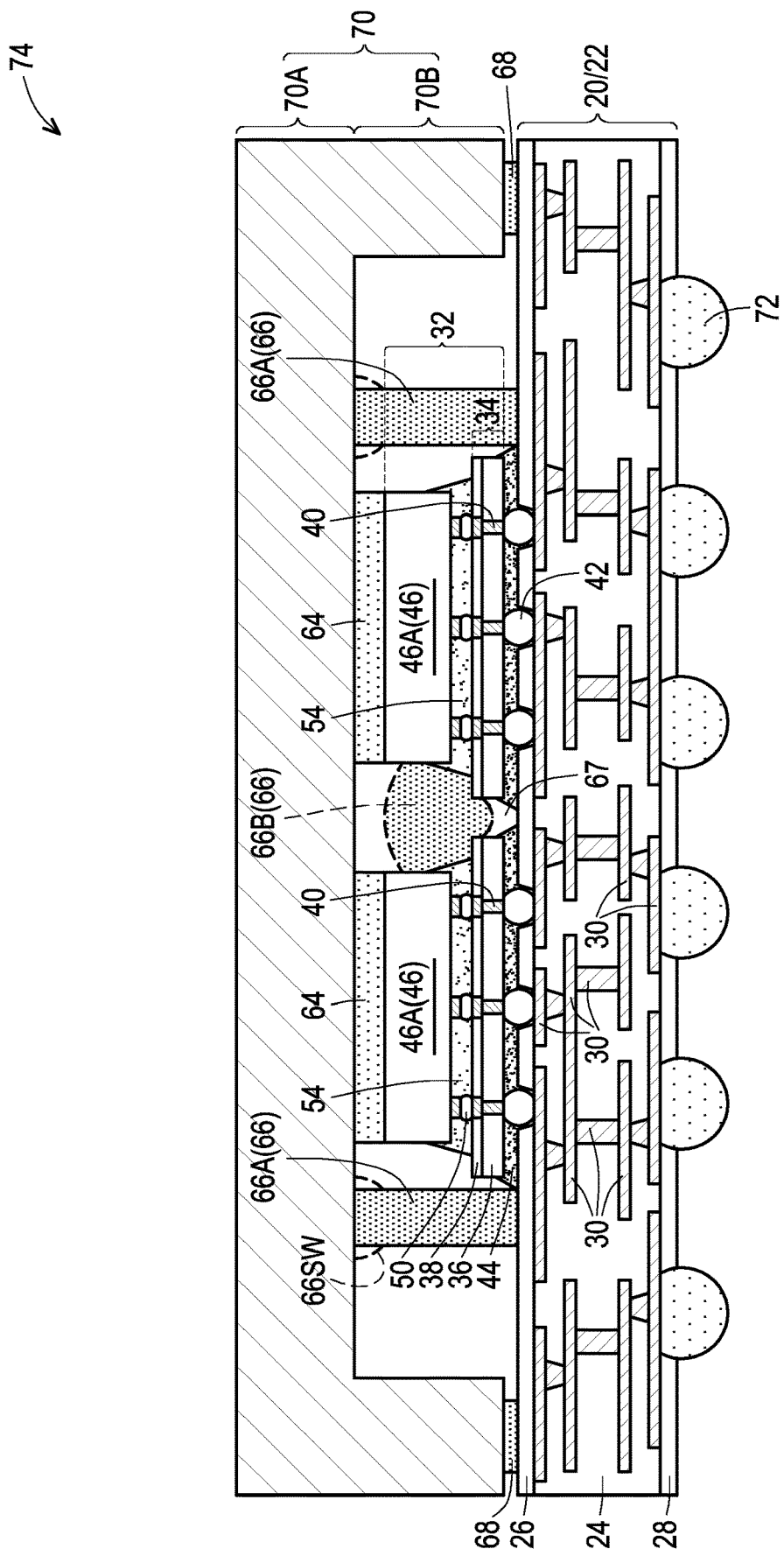
Figure 6B:
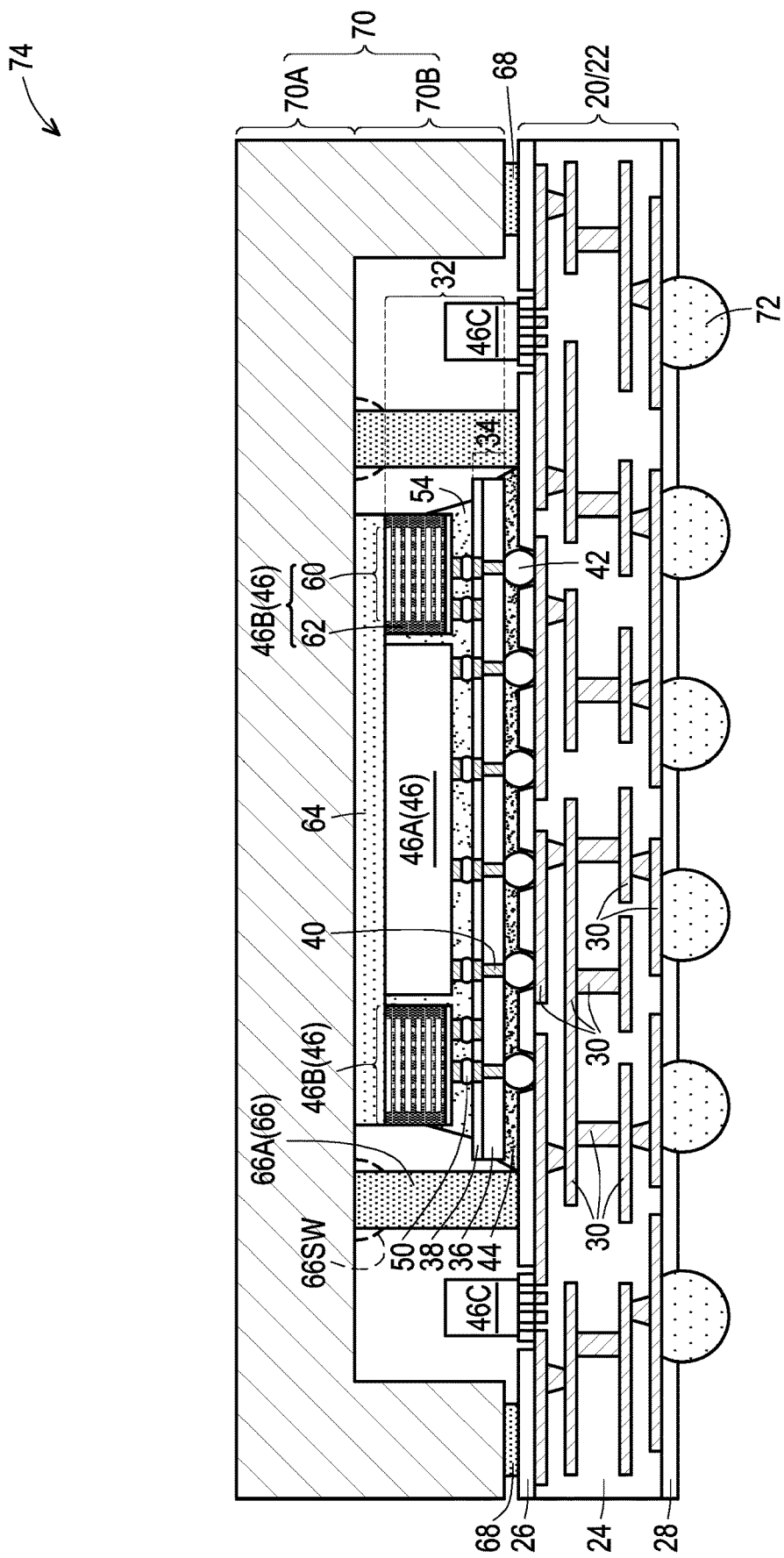
FIG. 6B illustrates the cross-sectional view of a package including adhesive features in accordance with some embodiments.
Figure 15:
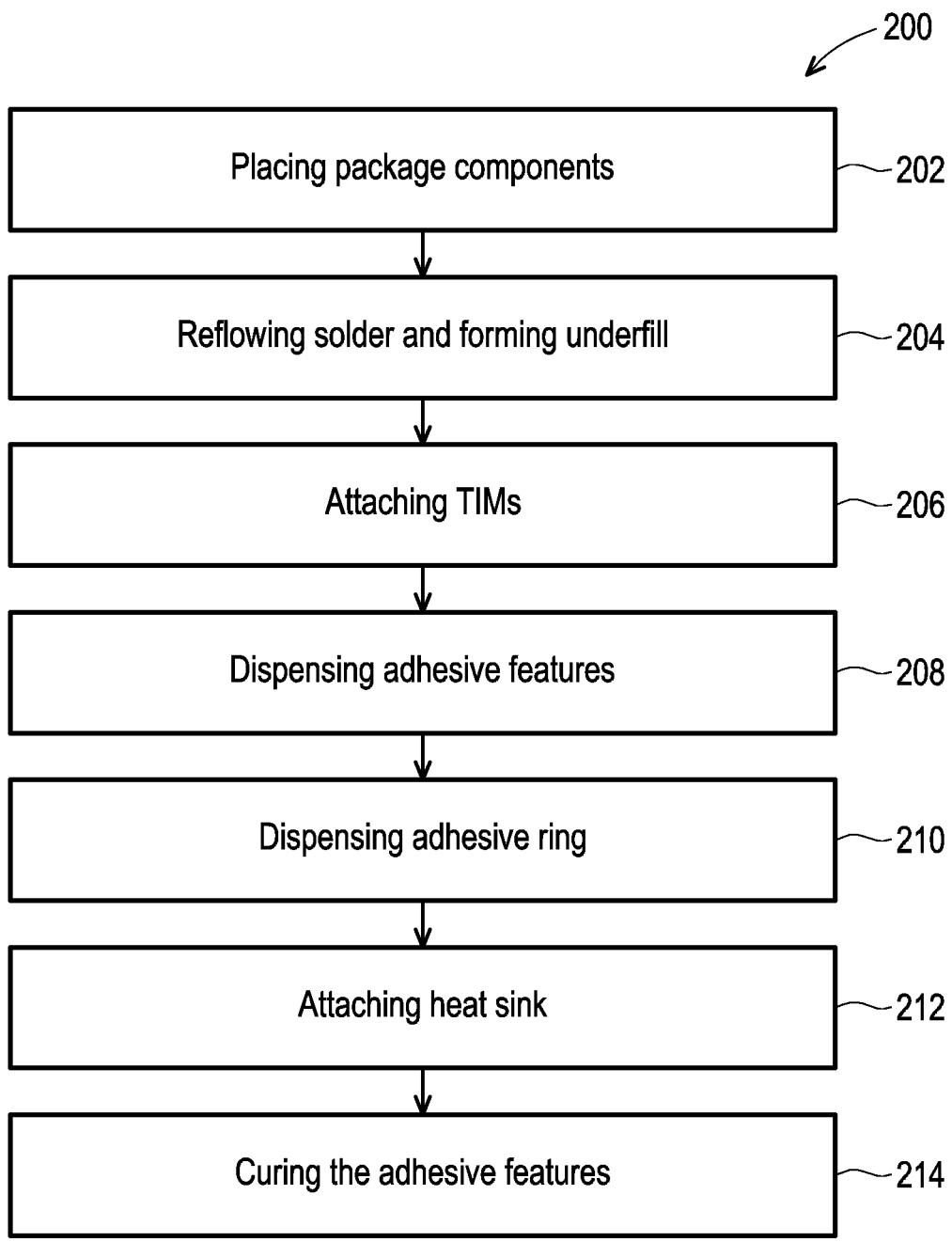
FIG. 15 illustrates a process flow for forming a package in accordance with some embodiments.

Further referring to FIG. 1, packages 32 (also referred to as package components) are placed on package component 20. The respective process is illustrated as process 202 in the process flow 200 as shown in FIG. 15. Although one group (such as two) packages 32 are illustrate, a plurality of groups of packages 32 are placed in this process, with each group being placed over a corresponding one of package components 22. Packages 32 include device dies therein, and may include other package components such as interposers, packages, die stacks, or the like. In accordance with some embodiments, packages 32 include package components 34, 46A, and 46B (FIG. 6B). In accordance with some embodiments, package components 34 are interposers, which include substrates 36 and the corresponding dielectric layers 38. Accordingly, package components 34 may also be referred to as interposers 34, while package components 34 may also be of other types. The structure of interposers 34 is illustrated schematically, and the details such as the plurality of dielectric layers on the top side and bottom side of substrate 36, metal lines and vias, metal pads, or the like, are not shown. Through-substrate vias 40 (sometimes referred to as through-silicon vias 40 when the substrate 36 is a silicon substrate) penetrate through substrate 36. Through-substrate vias 40 are used to interconnect the conductive features on the top side and the bottom side of substrate 36 to each other. Solder regions 42 may be underlying and joined to interposers, and are used to bond interposers 34 to package component 20. Other bonding schemes such as metal-to-metal direct bonding, hybrid bonding, or the like, may also be used for bonding package components 34 to package component 20.

In accordance with some embodiments, package components 46A (and 46B as shown in FIG. 6B) are bonded to the respective underlying package components 34. FIG. 1 illustrates a cross-section wherein one package component 46A is visible. Another cross-section view of package 32 is shown in FIG. 6B, which shows that package components 46B are also bonded to the same package component 34 (such as interposer) as package component(s) 46A. Package components 46A and 46B are different types of package components, and are collectively referred to as package components 46.

Each of package components 46 may be a device die, a package with a device die(s) packaged therein, a System-on-Chip (SoC) die including a plurality of integrated circuits (or device dies) integrated as a system, or the like. The device dies in package components 46 may be or may comprise logic dies, memory dies, input-output dies, Integrated Passive Devices (IPDs), or the like, or combinations thereof. For example, the logic device dies in package components 46 may be Central Processing Unit (CPU) dies, Graphic Processing Unit (GPU) dies, mobile application dies, Micro Control Unit (MCU) dies, BaseBand (BB) dies, Application processor (AP) dies, or the like. The memory dies in package components 46 may include Static Random Access Memory (SRAM) dies, Dynamic Random Access Memory (DRAM) dies, or the like. The device dies in package components 46 may include semiconductor substrates and interconnect structures.

In the subsequent discussion in accordance with some example embodiments, package components 46A are referred to as device dies, which may be SoC dies in accordance with some embodiments. Package components 46B may be memory stacks such as High-Performance Memory (HBM) stacks. Package components 46B may include memory dies 60 forming a die stack, and encapsulant 62 (such as a molding compound) encapsulating memory dies 60 therein. When viewed from top, encapsulant 62 may form a ring encircling memory dies 60.

Referring back to FIG. 1, package components 46 (such as 46A) may be bonded to the underlying package component 34, for example, through solder regions 50. Underfill 54 is dispensed between package components 46 and the underlying package component 34. In accordance with some embodiments, packages 32 are formed through a Chip-on-Wafer (CoW) bonding process, wherein package components 46, which are discrete chips/packages, are bonded to the package components 34 that are in an unsawed wafer to form a reconstructed wafer. In accordance with some embodiments, no molding compound is molded on package components 46. A reconstructed wafer is thus formed. The reconstructed wafer is sawed apart to form discrete packages 32, which are bonded to package component 20.

Figure 2:
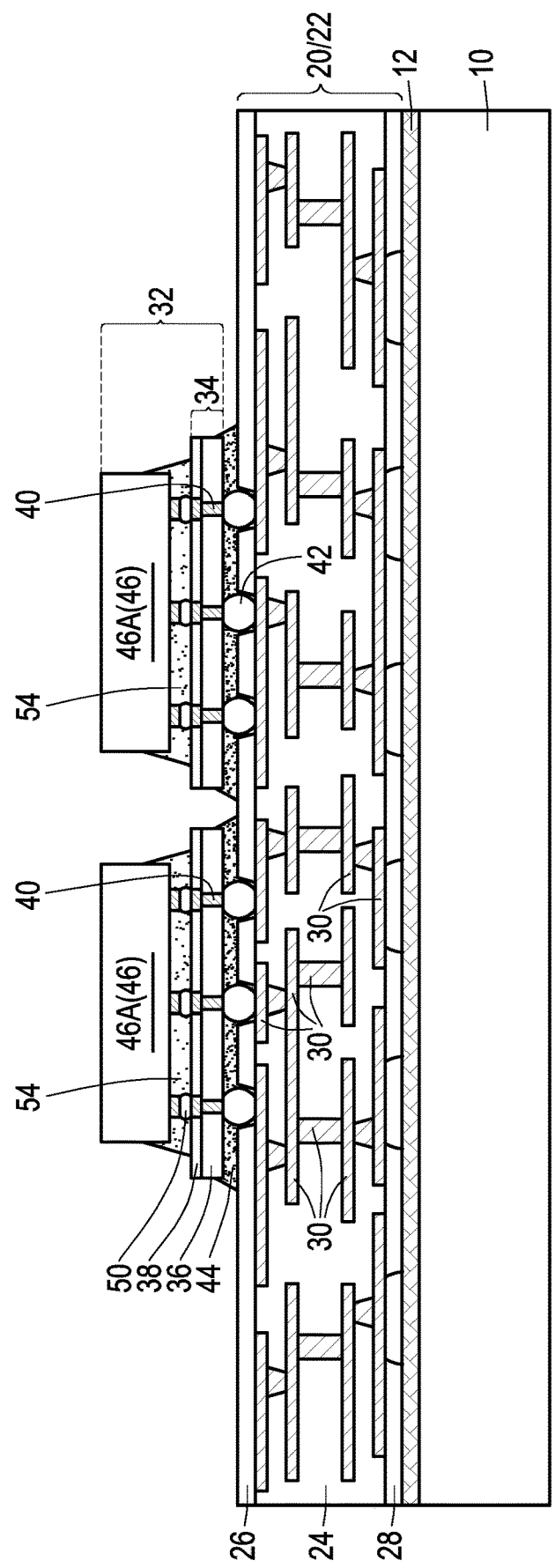

After the placement of packages 32 onto package component 20, solder regions 42 are reflowed, and underfill 44 may be dispensed between the gaps between packages 32 and 20. The resulting structure is shown in FIG. 2. The respective process is illustrated as process 204 in the process flow 200 as shown in FIG. 15. Referring to another cross-section as shown in FIG. 6B, there may be other package components such as Independent Passive Devices (IPDs) 46C bonding to package component 20. In accordance with some embodiments, IPDs 46C are discrete capacitors, discrete inductors, discrete resistors, or the like, and no active devices such as transistors are formed in IPDs 46C. In subsequent discussion, package components 20, 22, 34, 46A, 46B, and 46C are also referred to as package substrate strips 20, package substrates 22, interposers 34, device dies 46A, memory stacks 46B, and IPDs 46C, respectively, while it is appreciated that these package components may also be other types of package components such as what have been discussed in preceding paragraphs.

Figure 12:
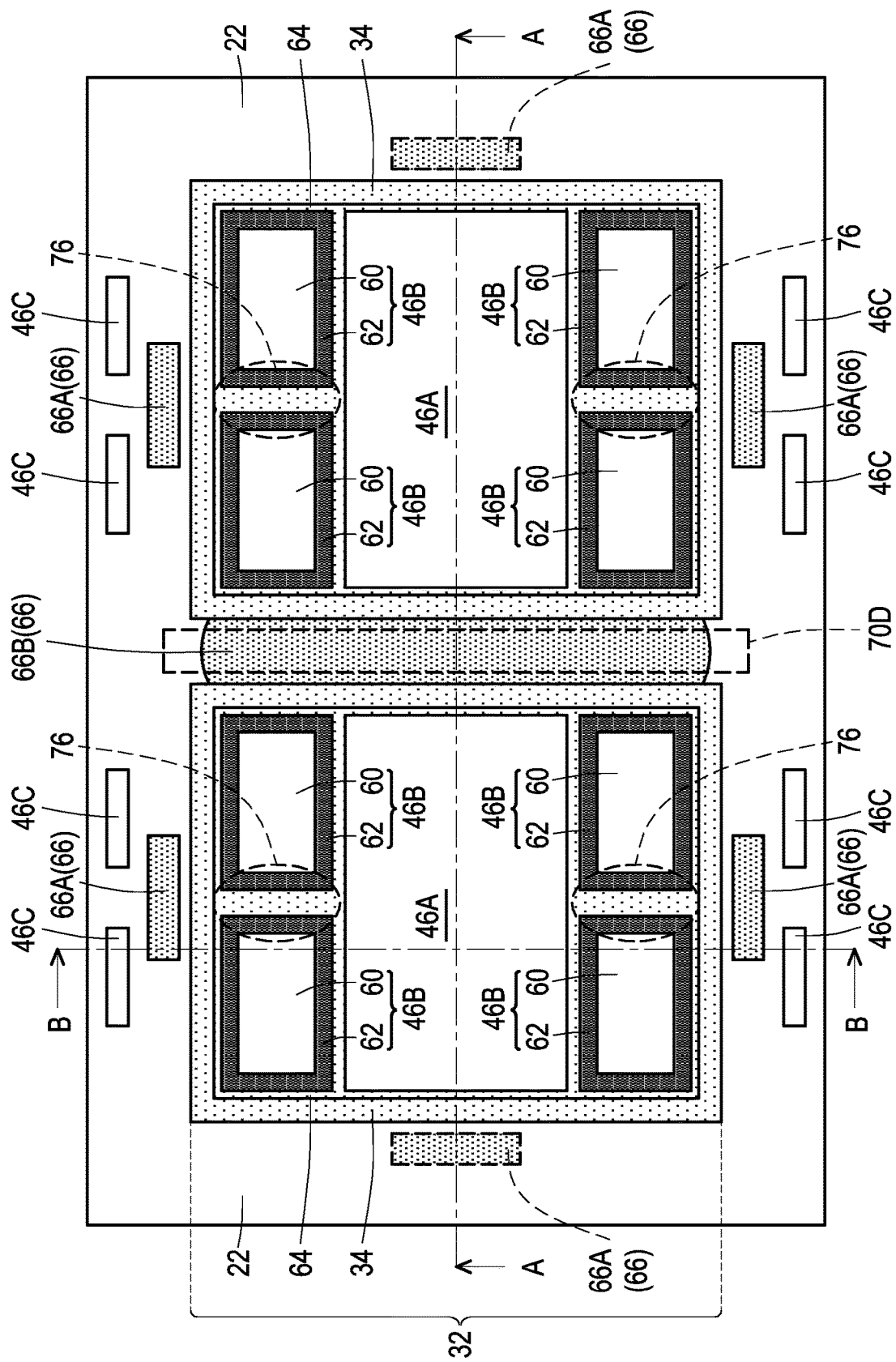
FIGS. 12-14 illustrate the top views of packages in accordance with some embodiments.

FIG. 12 illustrates an example top view of some features as shown in FIG. 2 (and FIG. 6A) and FIG. 6B. The reference cross-section A-A in FIG. 12 corresponds to the cross-sectional view shown in FIG. 2 and FIG. 6A, and the reference cross-section B-B in FIG. 12 corresponds to the cross-sectional view shown in FIG. 6B. As shown in FIG. 12, there may be two or more packages 32 bonding to the same package substrate 22. Each of packages 32 may include one or more device die(s) 46A, and a plurality of stacked memory stacks 46B. Each of memory stacks 46B may include memory dies 60 and molding compound 62 molding (and encircling) memory dies 60. Packages 32 are separated from each other by a space. IPDs 46C may be bonded to the peripheral regions of package component 22.

Figure 3:
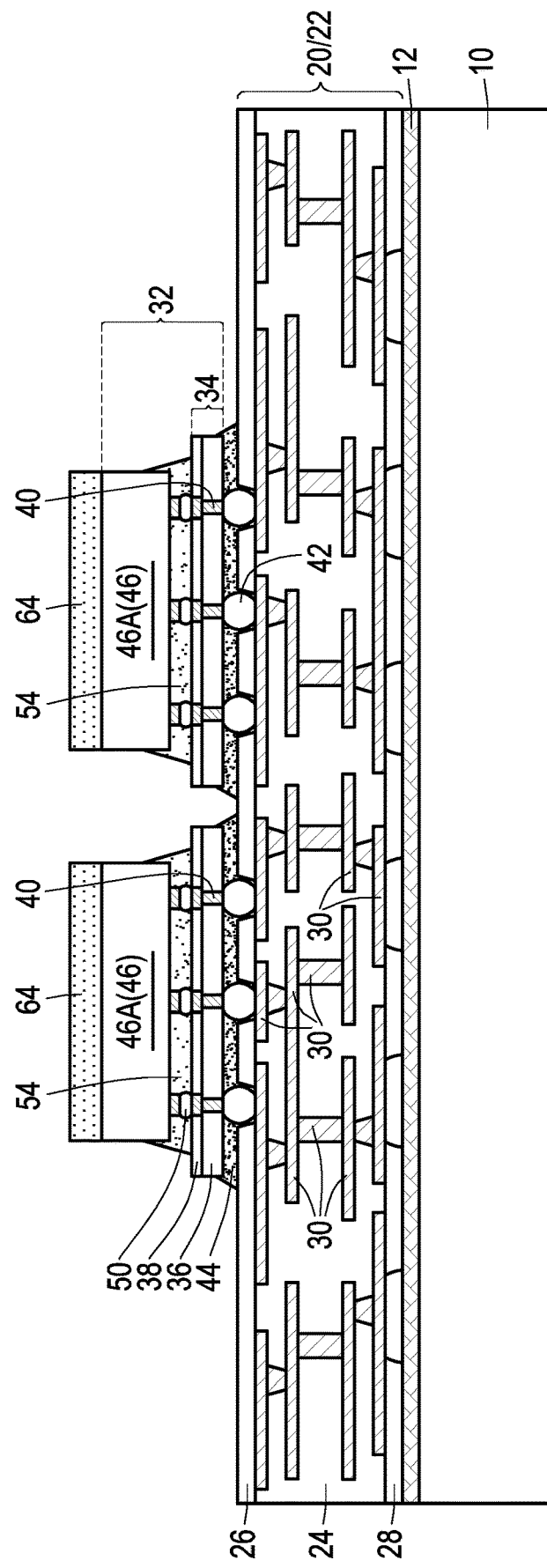

Referring to FIG. 3, TIMs 64 are attached to packages 32. The respective process is illustrated as process 206 in the process flow 200 as shown in FIG. 15. TIMs 64 are film-type TIMs, which are pre-formed solid TIMs at the time of attaching, as compared to liquid-type TIMs that are dispensed in a flowable form and then cured into solid. In accordance with some embodiments, TIMs 64 include a base material, which may be a polymer. The base material may be formed of or comprise a resin, acrylic, a PBO-based polymer, a silicon-based polymer, or the like. TIMs 64 may comprise rigid fillers, which may include graphite, graphene, metal particles, or the like therein. TIMs 64 may be picked and placed over packages 32, or may be applied through a roller. In accordance with some embodiments, as shown in FIG. 12, the top-view sizes of TIMs 64 may be greater than, equal to, or smaller than, the underlying packages 32. Accordingly, TIMs 64 are in contact with the top surfaces of device dies 46A and memory stacks 46B. TIMs 64 may have thermal conductivity values higher than about 1 W/k*m, higher than about 5 W/k*m, higher than about 10 W/k*m, or higher.

Figure 4:
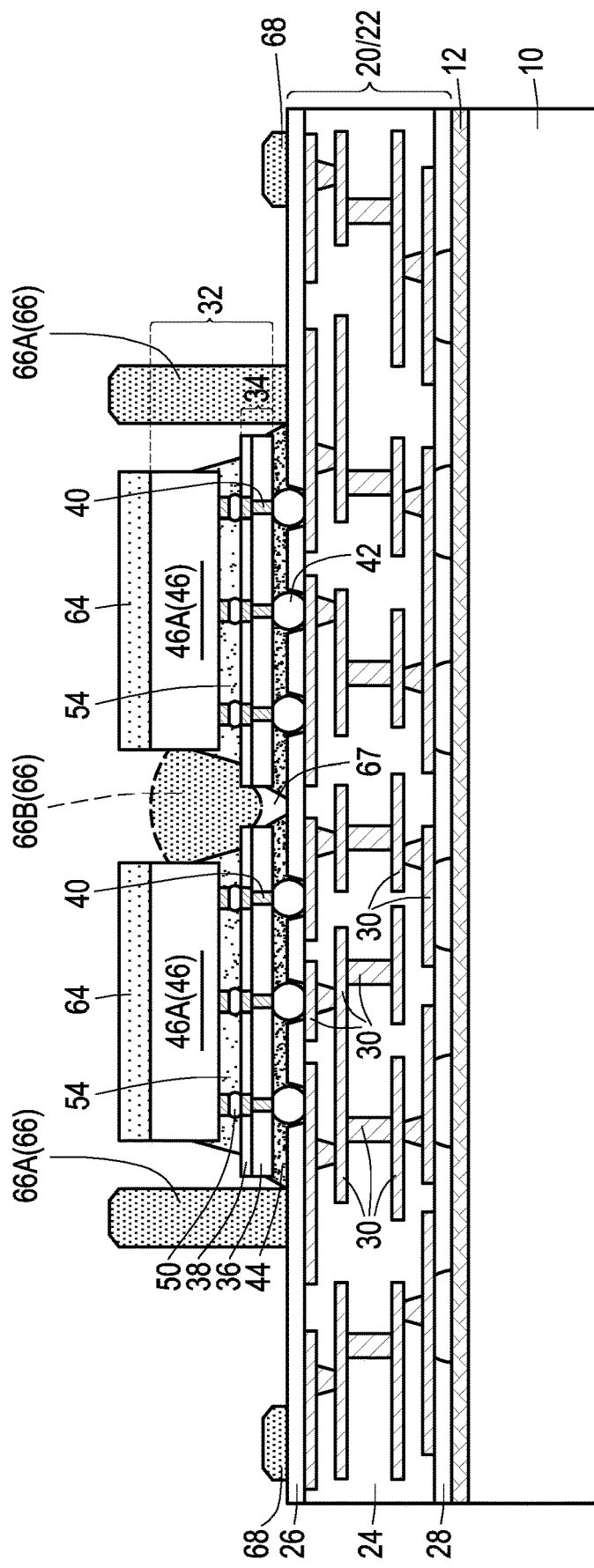

Referring to FIG. 4, adhesive features 66 are dispensed on top of package substrate 22, and may be in physical contact with package substrate 22. The respective process is illustrated as process 208 in the process flow 200 as shown in FIG. 15. In accordance with some embodiments, adhesive features 66 are flowable, and are dispensed through a dispenser. The viscosity of adhesive features 66 is high, so that after dispensing, adhesive features 66 may stand by themselves and maintain their shapes, until they are cured into solid. In accordance with some embodiments, adhesive features 66 include a base flowable material that is adhesive. In accordance with some embodiments, the base flowable adhesive is formed of or comprises a Si-based polymer, which may be polydimethylsiloxane (PDMS) or a like material. The properties of adhesive features 66 are discussed in subsequent paragraphs. The base flowable material in adhesive features 66 may be a homogeneous material, with the base flowable material in the entirety of adhesive features 66 being the same material.

In accordance with some embodiments, the entirety of adhesive features 66 is formed of a homogeneous material, for example, the flowable base material, with no filler added. In accordance with other embodiments, adhesive features 66 may include the base material and a filler (in the form of filler particles) in the base material. The filler particles have the function of improving the overall viscosity value of adhesive features 66. In accordance with some embodiments, the filler particles are formed of alumina (aluminum oxide), silica (silicon oxide), boron nitride, rubber, or the like. The filler particles may be pre-made solid particles, which are mixed with the flowable base material of the filler particles.

In accordance with some embodiments in which adhesive features 66 are flowable, adhesive features 66 are dispensed. The dispensing may be performed using a stencil and a squeegee to define the shape of adhesive features 66. Alternatively, adhesive features 66 are dispensed without using any stencil. When dispensed without using stencil, adhesive features 66 may have irregular shapes. For example, the sidewalls of adhesive features 66 may be non-vertical, for example, being slanted and curved. The top surfaces of adhesive features 66 may also be non-planar. For example, adhesive features 66 may have curved top surfaces, and may or may not have pointing tips. Furthermore, when dispensed without using a stencil, the shapes of adhesive features 66 are random and irregular, and the shapes of adhesive features 66 may be different from each other.

In accordance with some embodiments, adhesive features 66 are on the outer sides of packages 32, as illustrated by adhesive features 66A as an example. Adhesive features 66 are dispensed close to packages 32, and may be as close as possible to packages 32 as long as achievable by the process. In accordance with some embodiments, as illustrated in FIG. 4, adhesive features 66 are spaced apart from packages 32 by small gaps. Adhesive features 66 may also be spaced apart from the nearest underfill 44, or may be in contact with underfill 44. For example, the inner portions of adhesive features 66 may be overlapping and contacting the outer portions of underfill 44. The top surfaces of adhesive features 66A are higher than the top surfaces of TIMs 64 at the time of dispensing.

In accordance with some embodiments, there is a portion of adhesive features 66 (denoted as adhesive feature 66B) dispensed between packages 32 as a gap-filling material. Adhesive feature 66B contacts the sidewalls of packages 32. The top surface of adhesive feature 66B is lower than the top surfaces of TIMs 64, so that adhesive feature will not be squeezed onto the top surfaces of TIMs 64. The bottom surface of adhesive feature 66B may be in physical contact with the top surface of package substrate 22, or alternatively, separated from the top surface of package substrate 22 by air gap 67. Furthermore, the top surface of adhesive feature 66B may be higher than, level with, or lower than the top surfaces of packages 32. In accordance with alternative embodiments, adhesive feature 66B is not formed, and the gap between neighboring packages 32 remains unfilled in subsequent processes. In accordance with yet alternative embodiments, a filling material, for example, having an elongation value lower than the elongation value of adhesive feature 66A and a hardness value greater than the hardness value of adhesive feature 66A, may be dispensed into the gap between packages 32 as the filling region. Accordingly, adhesive feature 66B is illustrated as being dashed to indicate that it may or may not be formed, or may be formed using a material different from the material of adhesive features 66A.

FIG. 4 further illustrates the dispensing of adhesives 68, which are dispensed onto the top surface of package substrate 22. The respective process is illustrated as process 210 in the process flow 200 as shown in FIG. 15. Adhesives 68 may be dispensed as a ring encircling packages 32, or may be dispensed as discrete portions. In accordance with some embodiments, adhesives 68 and adhesive features 66A and 66B are formed of a same material. In accordance with alternative embodiments, adhesives 68 and adhesive features 66A and 66B are formed of different materials. The dispensing of adhesives 68 may be skipped when the subsequently attached heat sink 70 (FIG. 5) does not have a skirt attached to package substrate 20. The thermal conductivity value of adhesives 68 may be lower than the thermal conductivity of TIMs 64. For example, the thermal conductivity value of adhesives 68 may be lower than about 1 W/k*m, while higher thermal conductivity value may be adopted.

Figure 5:
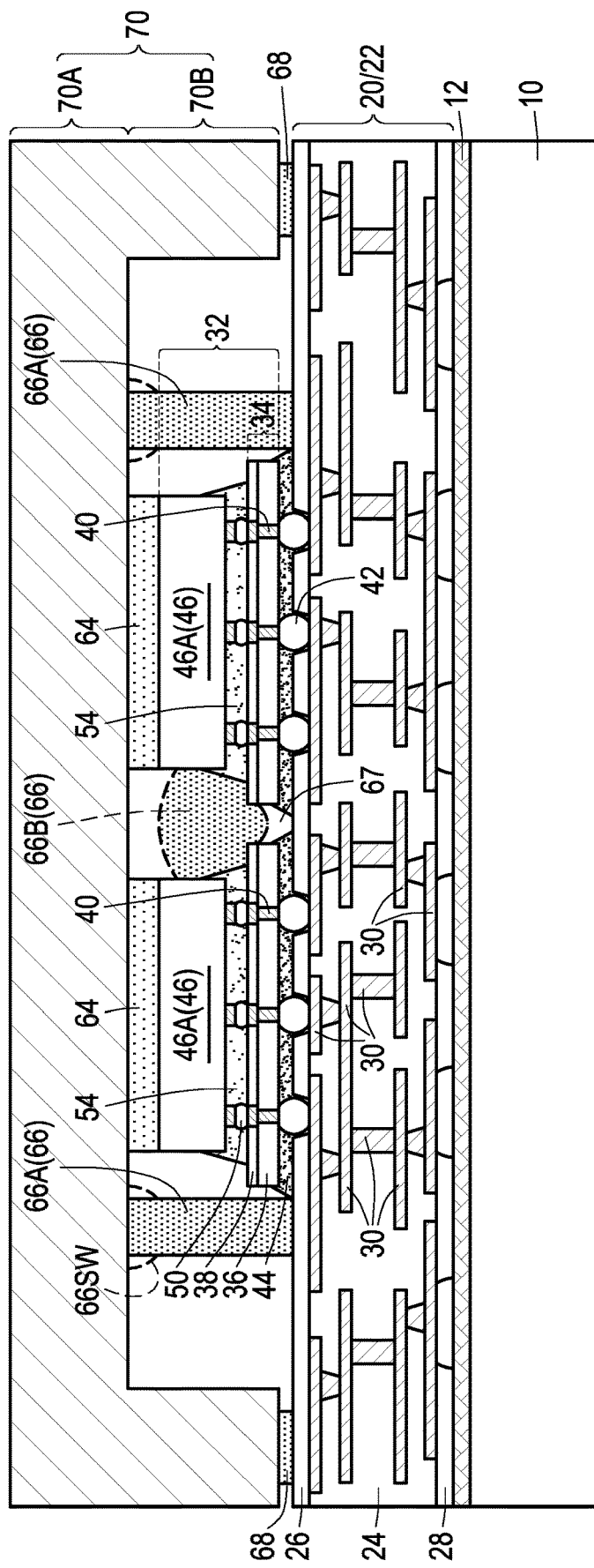
Figure 7:
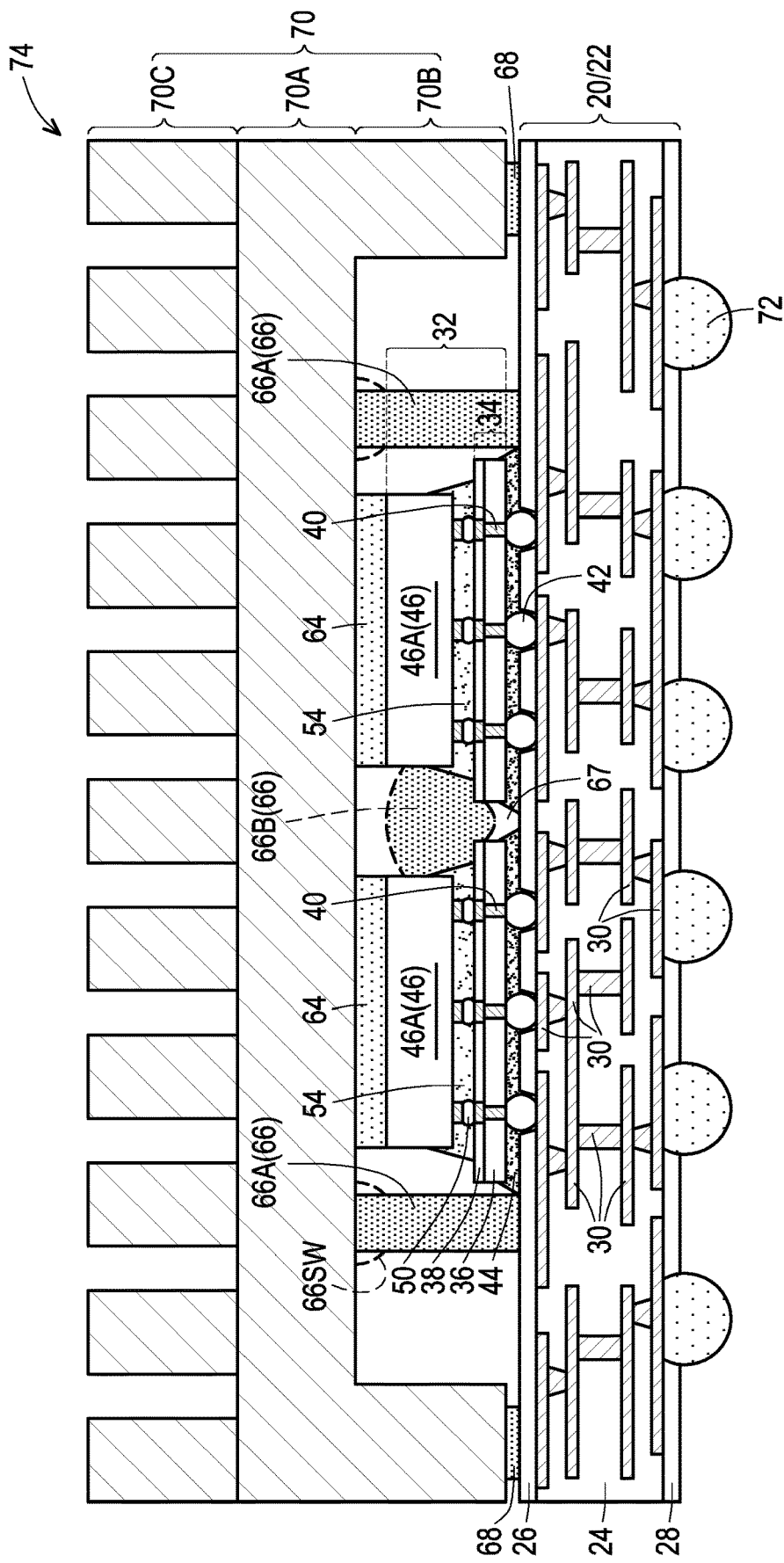
FIG. 7 illustrates the cross-sectional view of a package including adhesive features in accordance with some embodiments.

Next, referring to FIG. 5, heat sink (or lid) 70 is attached to the TIMs 64. Heat sink 70 is also a lid in accordance with some embodiments when it includes a lower portion, which is a skirt, and is referred to as heat sink hereinafter. The respective process is illustrated as process 212 in the process flow 200 as shown in FIG. 15. In accordance with some embodiments, package component 20 is at wafer-level and includes a plurality of package components 22. Accordingly, there are a plurality of heat sinks 70, each being attached to one of package components 22. In accordance with some embodiments, as shown in FIG. 5, heat sink 70 includes an upper portion 70A, with its bottom surface being planar and contacting TIMs 64. Heat sink 70 may further include a lower portion 70B, which extends down to join adhesives 68. The lower portion 70B may form a full ring encircling packages 32 and adhesive features 66A and 66B. The upper portion 70A may have a planar top surface as shown in FIG. 5. In accordance with alternative embodiments, the upper portion 70A includes fins (which may be an integrated part of heat sink 70, or may be a separate part that is adhered to upper portion 70A through another TIM), as shown in FIG. 7. In accordance with alternative embodiments, heat sink 70 does not include lower portion 70B. Accordingly, the process for dispensing adhesives 68, as shown in FIG. 4, may be skipped. During the attachment of heat sink 70, heat sink 70 is pushed down against adhesive features 66A, adhesives 68, and TIMs 64 to ensure the physical contact to these features. As a result, regardless of whether adhesive features 66A have straight sidewalls or non-straight sidewalls, the sidewalls of adhesive features 66A become non-straight and irregular after the heat sink 70 is pushed against it. The non-straight and irregular sidewalls are illustrated using dashed lines 66SW as an example. The non-straight and irregular sidewalls 66SW may extend from the top surface to the bottom surface of adhesive features 66A.

A curing process is then performed to solidify adhesive features 66 and adhesives 68. The respective process is illustrated as process 214 in the process flow 200 as shown in FIG. 15. In accordance with some embodiments, the curing process includes a thermal curing process, which is performed at a temperature in a range between about 120° C. and about 170° C. The curing duration may be in the range between about 150 minutes and about 180 minutes. After the curing process, the adhesive features 66 have a low modulus, and are softer than the underfills 44 and 54 and molding compound 62 (shown in FIG. 6B). Adhesive features 66 may also be elastic. Furthermore, the Coefficient of Thermal Expansion (CTE) of adhesive features 66 may be greater than the CTE of the underfills 44 and 54 and molding compound 62. Adhesive features 66A may shrink during the curing process. Being soft and elastic after the curing process, adhesive features 66A may pull heat sink 70 and package substrate 22 toward each other. This may compensate for the warpage of the resulting package so that the resulting package has lower warpage. Adhesive features 66A also pull heat sink 70 against packages 32, so that TIMs 64 are pressed against package 32. The delamination between TIMs 64 and packages 32 is thus reduced. Furthermore, molding compound 62 has inferior adhering to TIMs 64 than silicon, and the formation of adhesive features 66A may reduce the delamination between TIMs 64 and package components 46B.

Next, in accordance with some embodiments, package component 20 is de-bonded from carrier 10. In accordance with some embodiments, a light beam such as a laser beam is projected on release film 12, and release film 12 is de-composed under the heat of the light beam. Package component 20 and the overlying structures are thus released from carrier 10. The resulting structure is shown in FIG. 6A. Solder regions 72 may be placed on package component 22, and then reflowed, as also shown in FIG. 6A.

In a subsequent process, a singulation process may be performed to saw package component 20, so that package components 22 are separated into discrete package components. Each of package components 22 forms a package 74 with the respective overlying package components 46 and heat sink 70.

In the above-discussed embodiments, heat sinks 70 are attached on package components first, and then package component 20 is detached from carrier 10, followed by sawing package component 20. In accordance with alternative embodiments, package component 20 is detached from carrier 10 first, followed by sawing package component 20, and then heat sinks 70 are attached to discrete package components 22.

FIGS. 6A and 6B illustrate different cross-sections of package 74. The top view of package 74 may be found in FIG. 12, wherein the cross-section A-A as shown in FIG. 12 is shown in FIG. 6A, and the cross-section B-B as shown in FIG. 12 is shown in FIG. 6B. Heat sink 70 is not shown in FIG. 12. As shown in FIG. 12, adhesive features 66 may be placed where TIMs 64 are most likely to delaminate from the underlying features. The places where the delamination are most likely to occur include the regions where the density of molding compound is high, for example, the regions 76 where two memory stacks 46B are next to each other due to the use of molding compound 62 in memory stacks 46B. Accordingly, adhesive features 66A are formed close to the space between memory stacks 46B. Adhesive features 66 may be placed along the long edges of packages 32.

FIG. 7 illustrates a package 74 in accordance with alternative embodiments. The structures, materials, and the formation processes in accordance with these embodiments are essentially the same as shown in FIGS. 1-5, 6A, and 6B, except that heat sink 70 further includes fins 70C.

FIGS. 8, 9, 10A and 10B illustrate the cross-sectional views of intermediate stages in the formation of a package in accordance with alternative embodiments of the present disclosure. Unless specified otherwise, the materials and the formation processes of the components in these embodiments are essentially the same as the like components, which are denoted by like reference numerals in the preceding embodiments shown in FIGS. 1-5, 6A, and 6B. The details regarding the formation processes and the materials of the components shown in FIGS. 8, 9, 10A, and 10B may thus be found in the discussion of the preceding embodiments.

Figure 8:
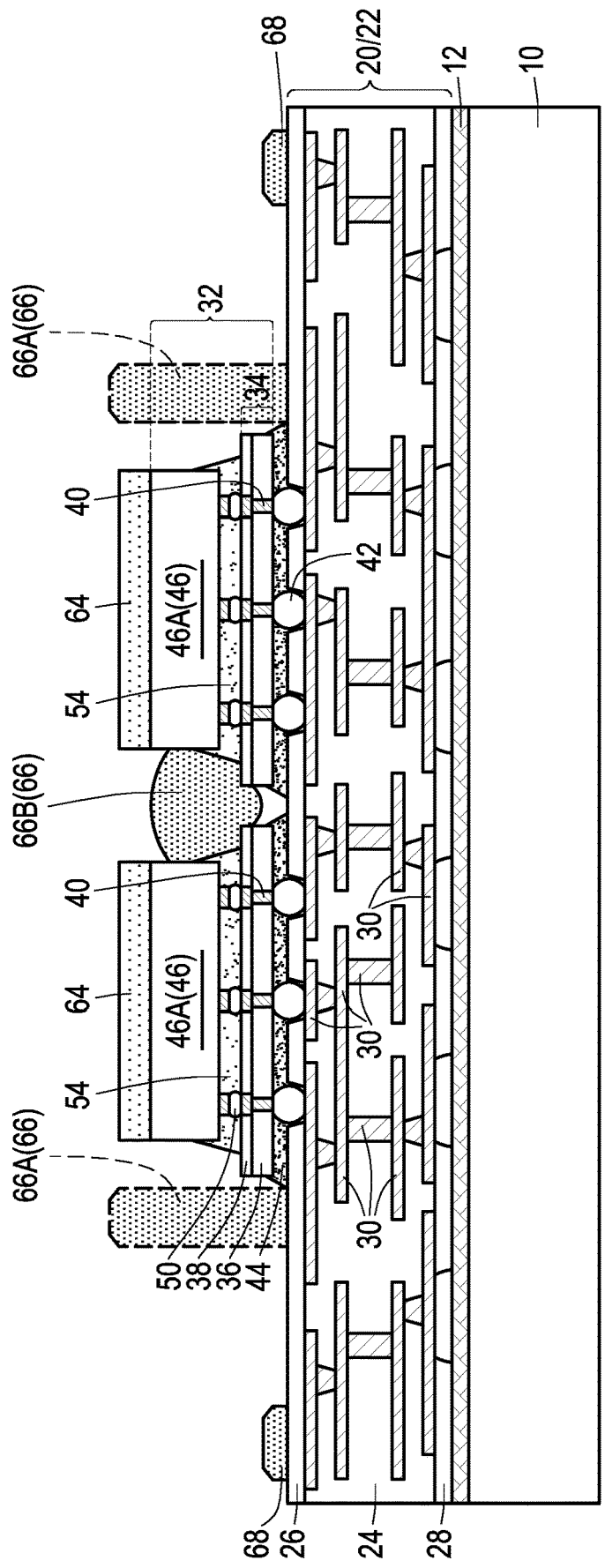
FIGS. 8, 9, 10A, and 10B illustrate the cross-sectional views of intermediate stages in the formation of a package including a bar-lid in accordance with alternative embodiments.

The initial processes of these embodiments are essentially the same as shown in FIGS. 1 through 4. The resulting structure is also shown in FIG. 8. In accordance with these embodiments, adhesive feature 66B is dispensed. The volume of adhesive feature 66B is related to the size of the heat sink bar 70D (FIG. 9), as will be discussed in subsequent paragraphs. On the other hand, adhesive features 66A may be, or may not be, dispensed. Accordingly, adhesive features 66A are illustrated as being dashed to indicate that these features may be, or may not be, formed. Adhesive 68 is also dispensed, and may be formed as a ring in accordance with some embodiments.

Figure 9:
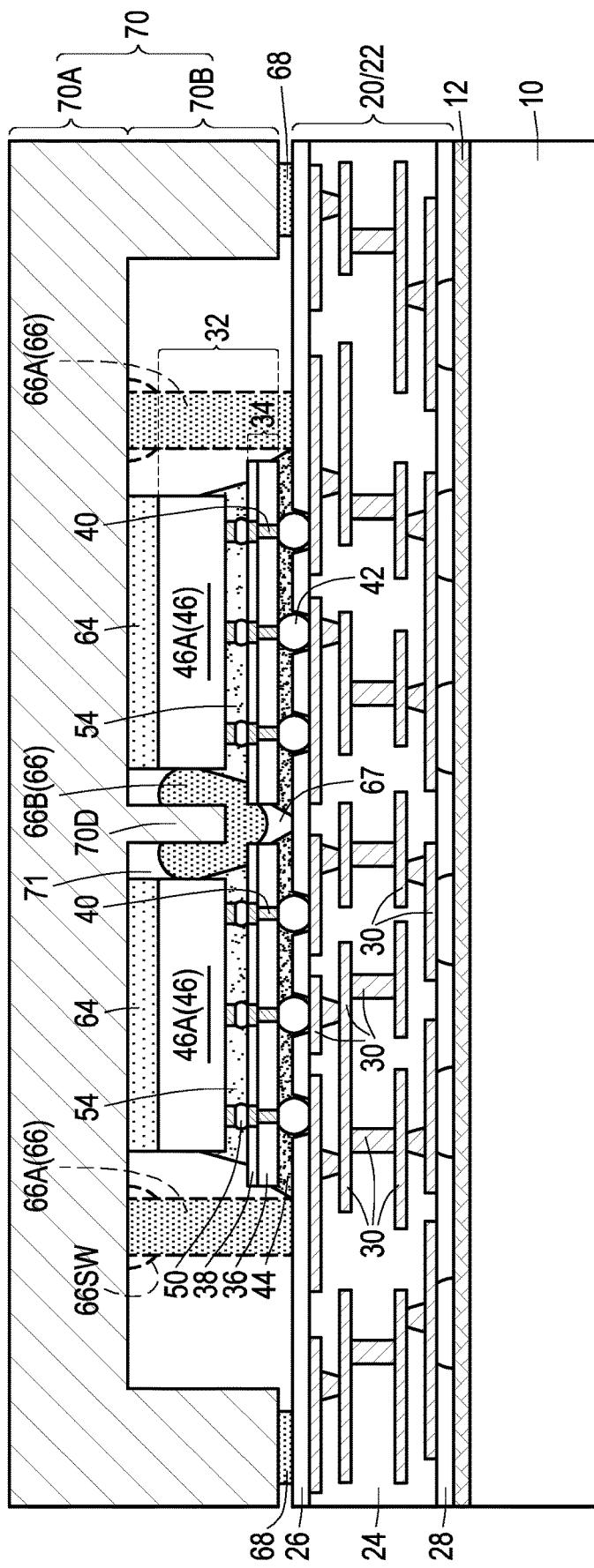

Next, referring to FIG. 9, heat sink 70 is placed and is pushed down. Although one heat sink 70 is illustrated, there may be a plurality of heat sinks 70 that are placed, each onto one of package components 22. Heat sink 70 is in physical contact with, and is attached to, TIMs 64 on one of package components 22. In accordance with some embodiments, heat sink 70 includes upper portion 70A, with its bottom surface being planar and contacting TIMs 64. Heat sink 70 may (or may not) include a lower portion 70B, which extends down to join adhesives 68. In addition, heat sink 70 further includes heat sink bar 70D, which extends from the bottom surface of upper portion 70A into the gap between neighboring packages 32. Portions 70A, 70B, and 70D may be portions of a same integrated region, with no interface in between. During the attachment of heat sink 70, heat sink 70 is pushed down against adhesive feature 66B (and 66A if it exists) and adhesives 68, and TIMs 64 to ensure the physical contact to these features.

Heat sink bar 70D is inserted into adhesive feature 66B. Heat sink bar 70D has a width smaller than the distance between packages 32, so that adhesive feature 66B may be squeezed and climbs up to the sidewalls of heat sink bar 70D. The top surface of the resulting adhesive feature 66B may be higher than, level with, or lower than the top surface of package 32. The contact area between adhesive feature 66B and heat sink bar 70D is thus increased to ensure good adhesion. On the other hand, there may be an air gap 71 left between adhesive feature 66B and upper portion 70A of heat sink 70. The volume of the dispensed adhesive feature 66B thus needs to take the volume of heat sink bar 70D into account. Leaving some air gap provides some process margin, so that adhesive feature 66B will not be squeezed to the top surfaces of TIMs 64.

Figure 10A:
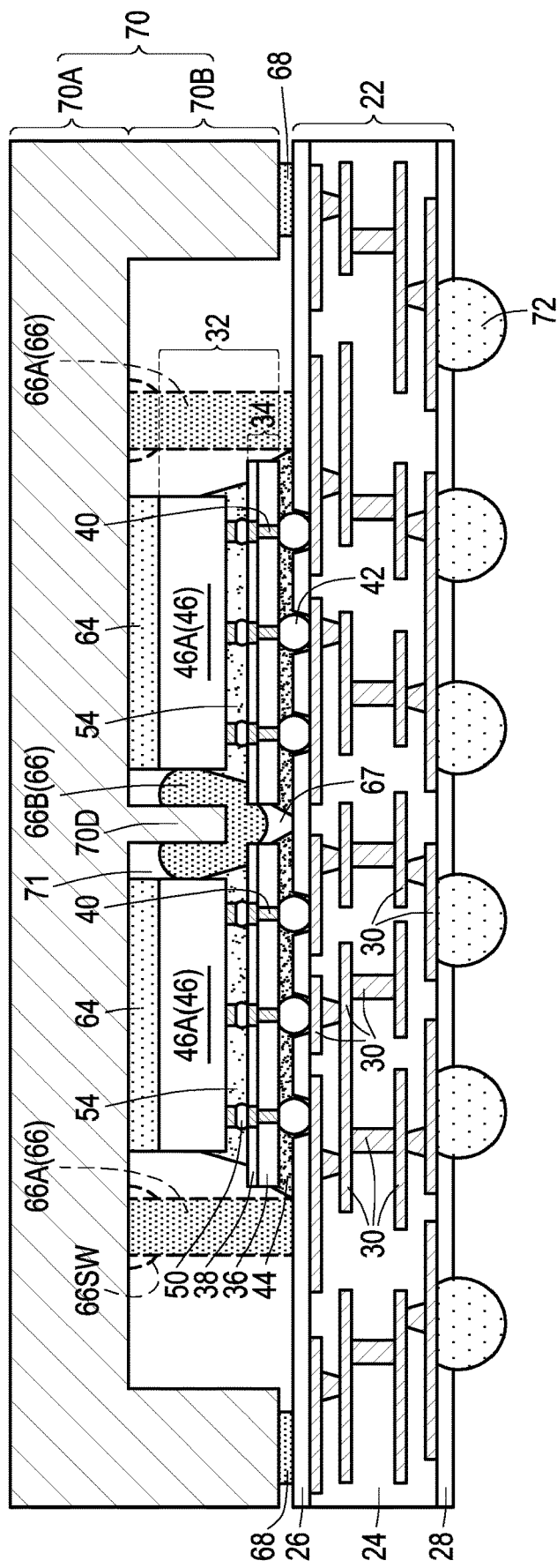
Figure 10B:
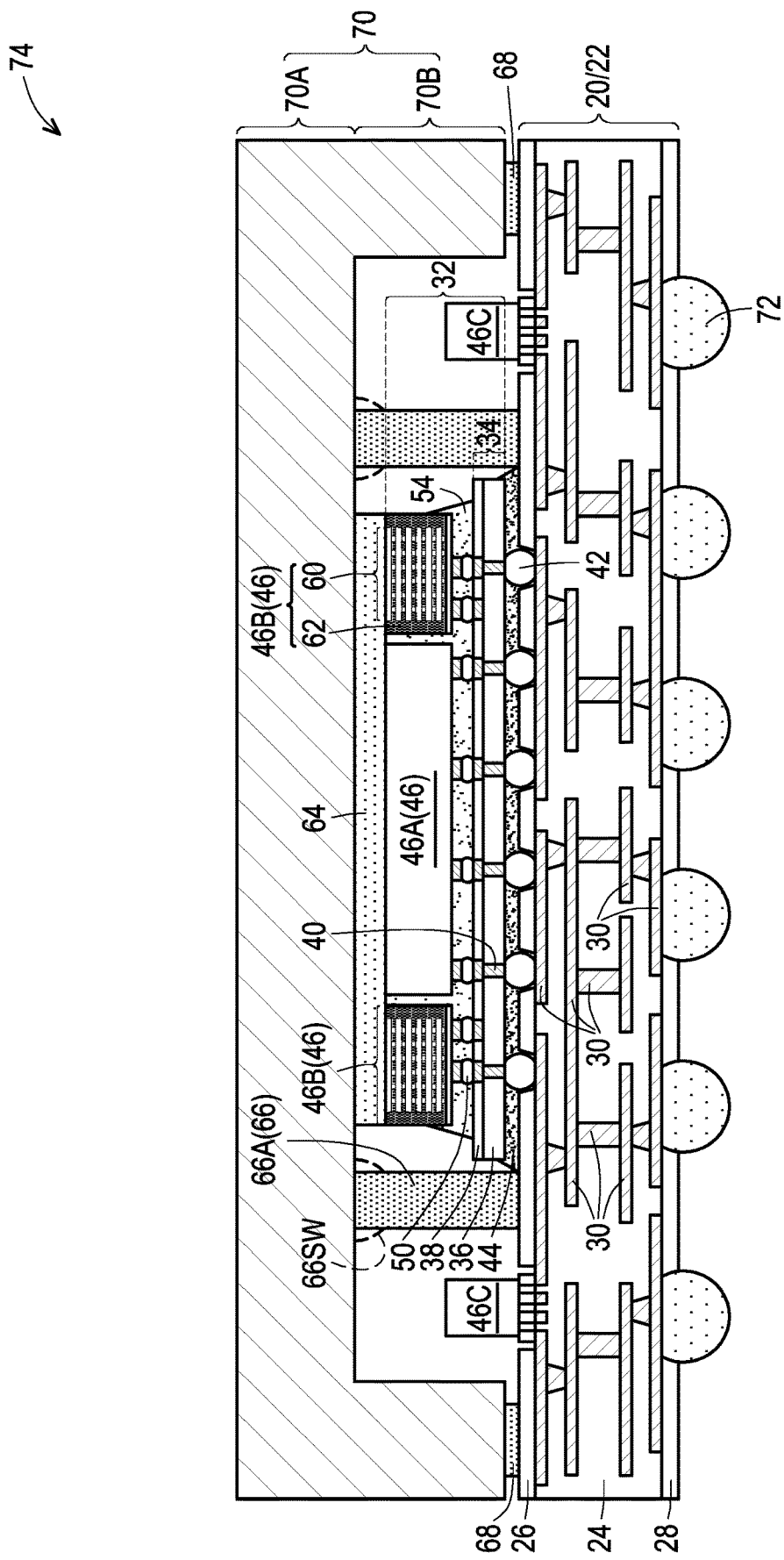

A curing process is then performed to solidify adhesive features 66 and adhesives 68. The curing process may be performed using similar temperature and similar curing duration as discussed in the preceding embodiments. After the curing process, package component 22 may be de-bonded from carrier 10, followed by the formation of solder regions 72. Package component 20 may then be sawed to separate package components 22 from each other, and packages 74 are formed, as shown in FIGS. 10A and 10B, which illustrate the cross-sections A-A, and B-B, respectively, in FIG. 12.

Adhesive feature 66B, rather than pulling upper portion 70A directly, applies force on heat sink bar 70D, which in turn pulls upper portion 70A toward package substrate 22. The delamination between TIMs 64 and packages 32 may thus be reduced. In accordance with some embodiments, adhesive features 66A are also formed to reduce the delamination.

Figure 11:
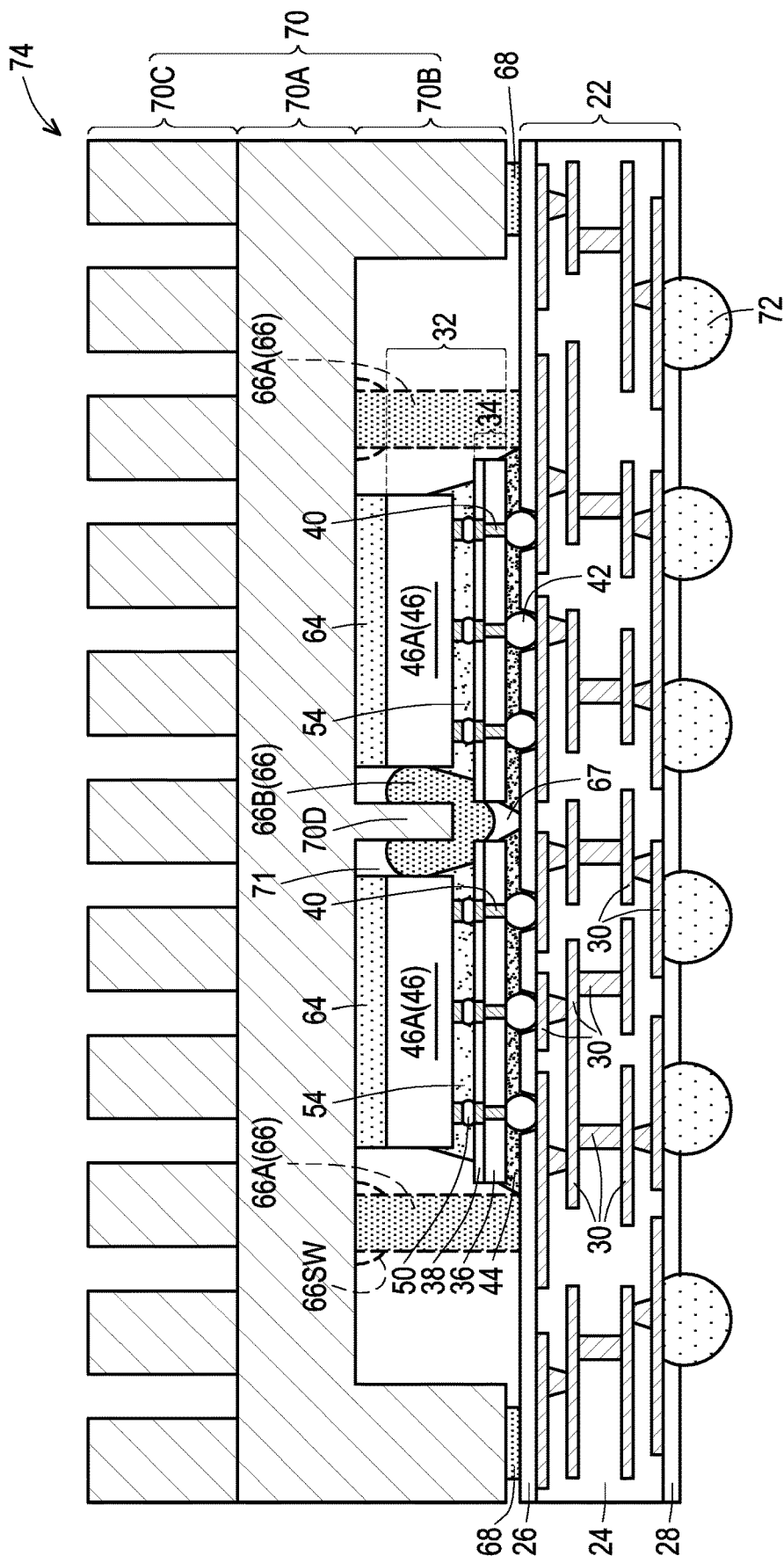
FIG. 11 illustrates the cross-sectional view of a package including a bar-lid and a heat sink having a fin in accordance with some embodiments.

FIG. 11 illustrates a package 74 in accordance with some embodiments. The structures, materials, and the formation processes in accordance with these embodiments are essentially the same as shown in FIGS. 8, 9, 10A and 10B, except that heat sink 70 further includes fins 70C. Fins 70C may be adhered to upper portion 70A through another TIM, or may be an integrated part of heat sink 70.

Figure 13:
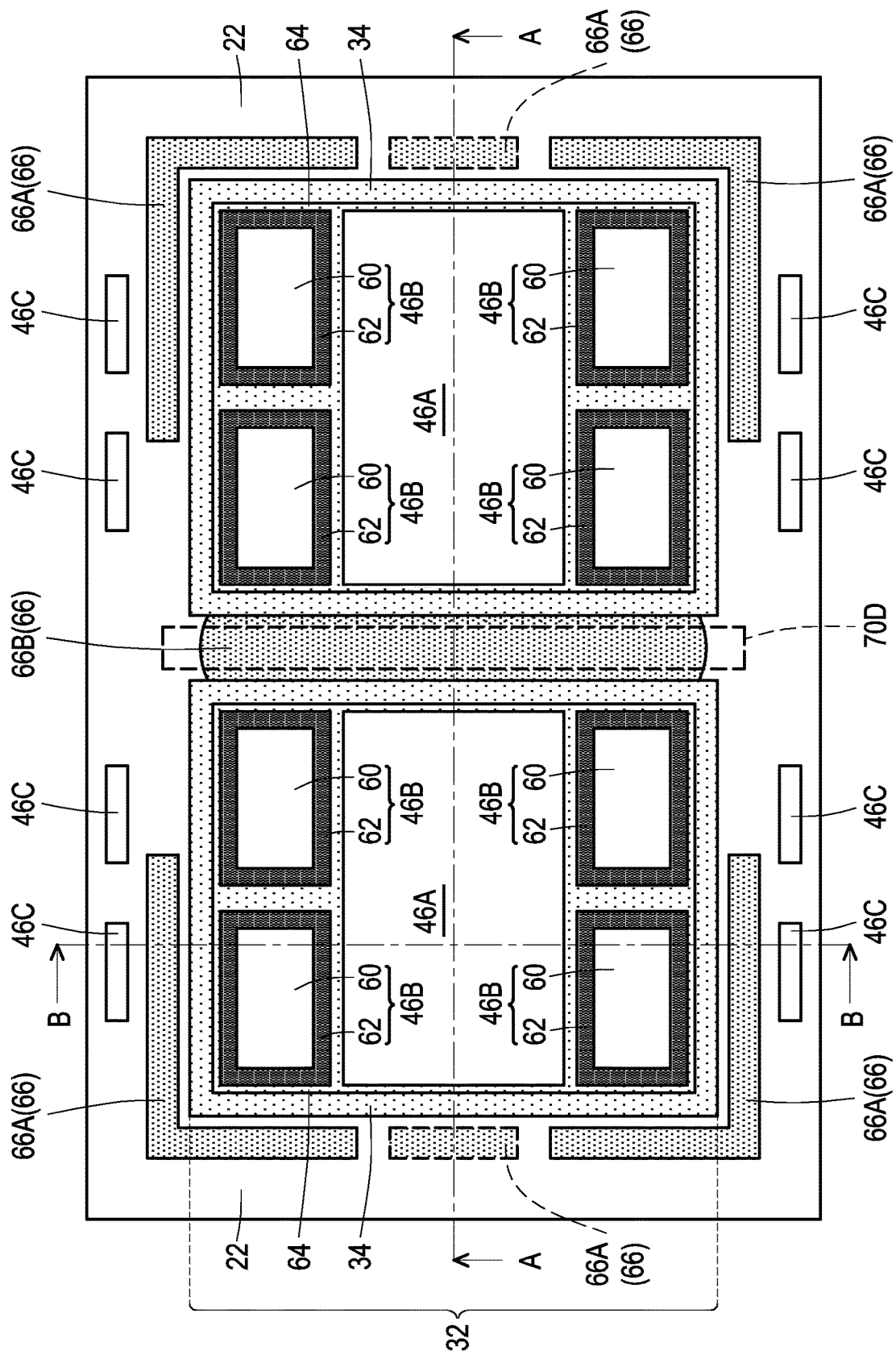
Figure 14:
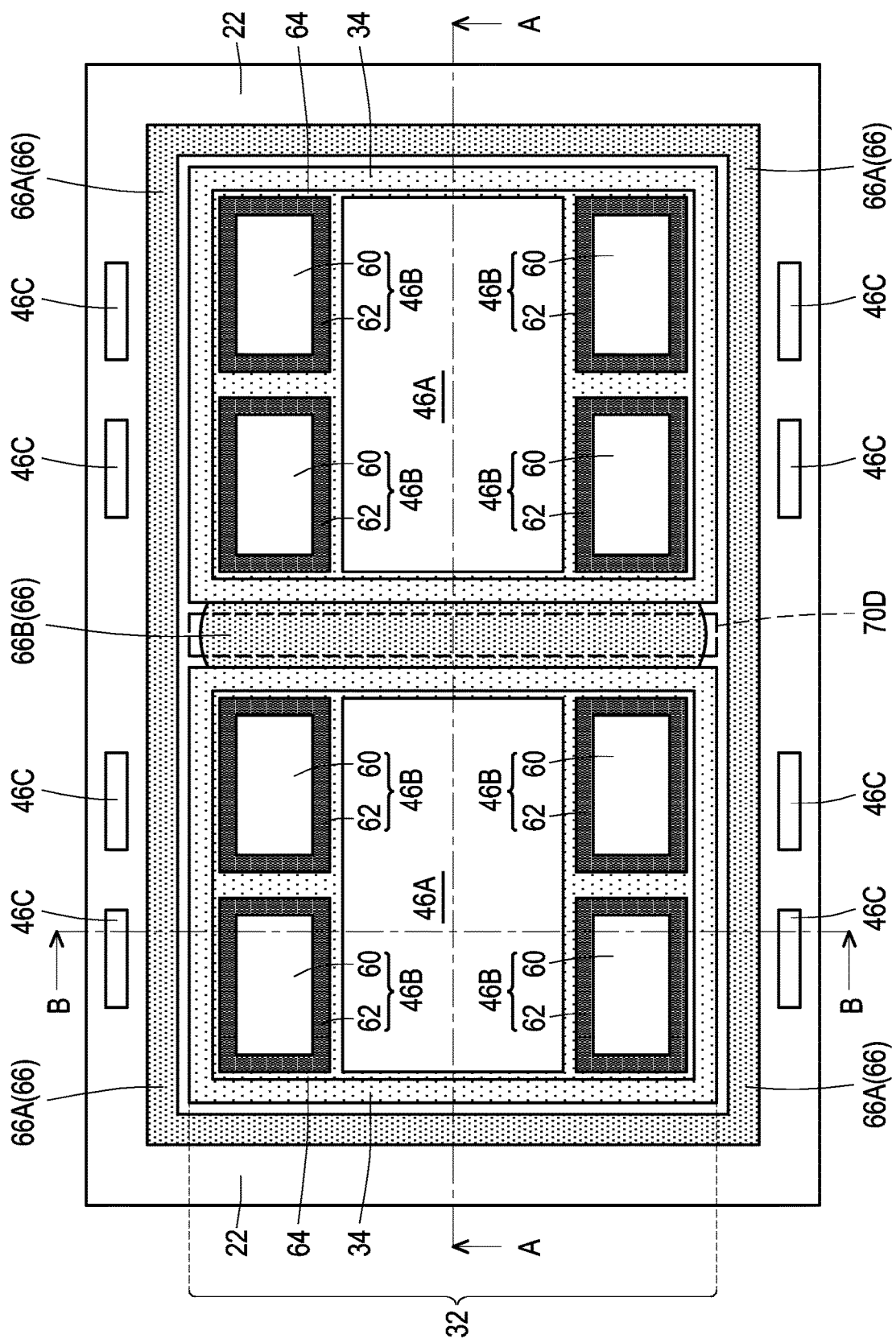

FIGS. 12 through 14 illustrate the top views of some components in packages 74 in accordance with some embodiments of the present disclosure. FIG. 12 illustrates an embodiment in which adhesive features 66A are formed in regions surrounding packages 32. For example, some adhesive features 66A may be formed close to the regions where memory stacks 46B are located close to each other. Adhesive feature 66B may be dispensed between two packages 32. Heat sink bar 70D may be or may not be formed, and when formed, is formed as an elongated bar, which may extend throughout the length of the space between packages 32, or substantially throughout the length (for example, greater than about 80 percent of the length) of the space between packages 32.

FIG. 13 illustrates an embodiment in which adhesive features 66A are formed close to the corners of packages 32, which are also the regions where delamination is more likely to occur. When memory stacks 46B are located close to each other (and hence molding compounds are in contact with TIMs 64), adhesive features 66A may extend to next to the spaces between neighboring memory stacks 46B. Adhesive feature 66B may be dispensed between two packages 32. Heat sink bar 70D may be or may not be formed, and when formed, is formed as an elongated bar, which may extend throughout the length of the space between packages 32, or substantially throughout the length (for example, greater than about 80 percent of the length) of the space between packages 32.

FIG. 14 illustrates an embodiment in which adhesive features 66A are formed as a ring fully encircling packages 32. Adhesive feature 66B may be dispensed between two packages 32. Either one end, or both ends, of adhesive feature 66B may be physically separated from adhesive feature 66A as discrete features. Alternatively, either one end or both ends of adhesive feature 66B may be physically joined with adhesive feature 66A. Heat sink bar 70D may be or may not be formed, and when formed, may be inserted into adhesive feature 66B, but not into adhesive feature 66A in accordance with some embodiments. In accordance with alternative embodiments, heat sink bar 70D may be inserted into both of adhesive feature 66B and adhesive feature 66A. In accordance with these embodiments, heat sink bar extends beyond the space between packages 32.

In each of the embodiments in FIGS. 12, 13, and 14, adhesive features 66A and 66B may be formed in various combinations. In accordance with some embodiments, adhesive features 66A are formed, while adhesive feature 66B is not formed. In accordance with alternative embodiments, adhesive features 66B is formed, while adhesive features 66A are not formed. In accordance with yet alternative embodiments, both of adhesive features 66A and adhesive feature 66B are formed. When adhesive feature 66B is formed, there may be, or may not be, heat sink bar 70D in accordance with various embodiments.

By using the embodiments of the present disclosure, the warpage of the packages may be reduced, and delamination may be reduced. The embodiments may be applied to large packages, for example, with length and width greater than 50 mm or 75 mm. Experiments have been performed to form a first sample package not including adhesive features 66A, and a second sample package including adhesive features 66A. Coplanarity values of the first sample package and the second sample package are measured. The coplanarity value of 0 indicates no warpage, and the larger the coplanarity value is, the worse the warpage is. The coplanarity of the first sample package is 293 μm, while the coplanarity of the second sample package is reduced to 264 μm. Accordingly, by adopting the embodiments of the present disclosure, the warpage is reduced by about 9.8 percent. Furthermore, the TIM coverage of the second sample package is also better than the first sample package, wherein TIM coverage represents how much percent of the TIM area that are supposed to adhere to the underlying features actually adheres to the underlying features without delamination, and 100 percent indicates no delamination. The TIM coverage of the first sample package is between about 94 percent and about 95 percent, and the TIM coverage of the second sample package is improved to between about 98 percent and about 99 percent.

In addition, experiment results also revealed that the heat sink bar may help to reduce the warpage. This may be attributed to the reinforcement of the heat sink (and the resulting package) due to the added thickness in some part of the heat sink, and also possibly due to the pulling force applied through adhesive feature 66B. Experiments are performed to form a third sample package not including heat sink bar 70D, and a fourth sample package including heat sink bar 70D. The coplanarity of the heat sink in the third sample package is 140 μm, while the coplanarity of the heat sink in the fourth sample package is reduced to 125 μm. Furthermore, the TIM coverage of the third sample package is between about 94 percent and about 95 percent, and the TIM coverage of the fourth sample package is improved to 99 percent.

In above-illustrated embodiments, some processes and features are discussed in accordance with some embodiments of the present disclosure to form a three-dimensional (3D) package. Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The embodiments of the present disclosure have some advantageous features. By applying adhesive features, the delamination of TIMs from the underlying features is reduced. Also, the warpage of the package is reduced. The formation of the heat sink bar also contributes to the reduction of delamination and warpage.

In accordance with some embodiments of the present disclosure, a method comprises bonding a first package and a second package over a package component; adhering a first TIM and a second TIM over the first package and the second package, respectively; dispensing a first adhesive feature on the package component; placing a heat sink over and contacting the first adhesive feature, wherein the heat sink comprises a portion over the first TIM and the second TIM; and curing the first adhesive feature. In accordance with an embodiment, the method further comprises dispensing an underfill between the first package and the package component, wherein the first adhesive feature further comprises an addition portion overlapping and contacting the underfill. In accordance with an embodiment, the first adhesive feature has a lower modulus value than the underfill. In accordance with an embodiment, at a first time after the first adhesive feature is dispensed and before the first adhesive feature is cured, the first adhesive feature has a first top surface higher than a second top surface of the first TIM. In accordance with an embodiment, at a second time after the heat sink is placed, the first adhesive feature has a third top surface coplanar with the second top surface of the first TIM. In accordance with an embodiment, the first adhesive feature is dispensed to a first side of the first package, and the second package is on a second side of the first package opposite to the first side. In an embodiment, the method further comprises dispensing a second adhesive feature over the package component, wherein the second adhesive feature has a first top surface lower than a second top surface of the first TIM. In accordance with an embodiment, the heat sink comprises an upper portion higher than the first TIM and the second TIM; and a heat sink bar extending from a bottom surface of the upper portion into a space between the first package and the second package, wherein the heat sink bar is inserted into the second adhesive feature. In an embodiment, the method further comprises dispensing an adhesive ring surrounding the first package and the second package, wherein the heat sink comprises a lower portion contacting the adhesive ring. In accordance with an embodiment, the first adhesive feature comprises a base material and filler particles mixed in the base material. In accordance with an embodiment, the first TIM and the second TIM are pre-formed solid TIMs when adhered over the first package and the second package, respectively.

In accordance with some embodiments of the present disclosure, a package comprises a package component; a first package and a second package bonded over the package component; a first TIM and a second TIM over the first package and the second package, respectively; a first adhesive feature on the package component; and a heat sink over and contacting the first adhesive feature, wherein the heat sink is further over the first TIM and the second TIM. In accordance with an embodiment, the heat sink is in physical contact with the first TIM and the second TIM. In accordance with an embodiment, the first adhesive feature comprises non-straight sidewalls. In accordance with an embodiment, the package further comprises an underfill between the first package and the package component, wherein a first portion of the first adhesive feature is over and contacting a second portion of the underfill. In accordance with an embodiment, the package further comprises a second adhesive feature on the package component, wherein the second adhesive feature is between the first package and the second package, and is separated from the heat sink by an air gap. In accordance with an embodiment, the heat sink comprises an upper portion higher than the first TIM and the second TIM; and a heat sink bar extending from a bottom surface of the upper portion, wherein the heat sink bar extends into the second adhesive feature.

In accordance with some embodiments of the present disclosure, a package comprises a package substrate; a package component over and bonded to the package substrate, the package component comprising an interposer; and a device die over and bonding to the interposer; a lid comprising an upper portion over the package component; and an adhesive feature between, and in physical contact with, the lid and the package substrate, wherein a first top surface of the adhesive feature is higher than a second top surface of the package component. In accordance with an embodiment, the package further comprises a thermal interface material between, and in physical contact with, the package component and the lid. In accordance with an embodiment, the package further comprises an underfill between the package component and the package substrate, wherein the package component comprises a molding compound molding the device die, and wherein the adhesive feature is softer than both of the molding compound and the underfill.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
bonding a first package and a second package over a package component;
adhering a first Thermal Interface Material (TIM) and a second TIM over the first package and the second package, respectively;
dispensing a first adhesive feature on the package component; and
placing a heat sink over and contacting the first adhesive feature, wherein the heat sink comprises a portion over the first TIM and the second TIM, wherein at a first time after the first adhesive feature is dispensed and before the first adhesive feature is cured, the first adhesive feature has a first top surface higher than a second top surface of the first TIM, and wherein at a second time after the heat sink is placed, the first adhesive feature has a third top surface coplanar with the second top surface of the first TIM; and
curing the first adhesive feature.

2. The method of claim 1, wherein the first adhesive feature is spaced apart from the first package and the second package.

3. The method of claim 1 further comprising dispensing an underfill between the first package and the package component, wherein the first adhesive feature has a lower modulus value than the underfill.

4. The method of claim 1, wherein the first adhesive feature is dispensed to a first side of the first package, and the second package is on a second side of the first package opposite to the first side.

5. The method of claim 1 further comprising dispensing a second adhesive feature over the package component, wherein the second adhesive feature has a fourth top surface lower than the second top surface of the first TIM.

6. The method of claim 5, wherein the heat sink comprises:
an upper portion higher than the first TIM and the second TIM; and
a heat sink bar extending from a bottom surface of the upper portion into a space between the first package and the second package, wherein the heat sink bar is inserted into the second adhesive feature.

7. The method of claim 1 further comprising dispensing an adhesive ring surrounding the first package and the second package, wherein the heat sink comprises a lower portion contacting the adhesive ring.

8. The method of claim 1, wherein the first adhesive feature comprises a base material and filler particles mixed in the base material.

9. The method of claim 1, wherein the first TIM and the second TIM are pre-formed solid TIMs when adhered over the first package and the second package, respectively.

10. A method comprising:
bonding a first package and a second package over a package component;
disposing a first Thermal Interface Material (TIM) and a second TIM over the first package and the second package, respectively;
dispensing a first adhesive feature on the package component; and
placing a heat sink over and contacting the first adhesive feature, wherein the heat sink is further over the first TIM and the second TIM, and a portion of the heat sink is inserted into the first adhesive feature.

11. The method of claim 10, wherein the heat sink is placed in physical contact with the first TIM and the second TIM, and wherein the first adhesive feature is pressed by the heat sink, so that a first top surface of the first adhesive feature is pressed to be coplanar with a second top surface of the first TIM.

12. The method of claim 10, wherein the first adhesive feature comprises non-straight sidewalls when disposed, and wherein after the portion of the heat sink is inserted, a straight sidewall of the first adhesive feature is generated.

13. The method of claim 10 further comprising dispensing an underfill between the first package and the package component, wherein a first portion of the first adhesive feature is over and contacting a second portion of the underfill.

14. The method of claim 10, wherein the first adhesive feature is between the first package and the second package, and is separated from the heat sink by an air gap.

15. The method of claim 10, wherein the heat sink comprises:
an upper portion higher than the first TIM and the second TIM; and
a heat sink bar extending from a bottom surface of the upper portion, wherein the heat sink bar is inserted into the first adhesive feature.

16. A method comprising:
bonding a package component over a package substrate, the package component comprising:
an interposer;
a device die over and bonding to the interposer; and
a molding compound molding the device die;
dispensing an underfill between the package component and the package substrate;
dispensing a first adhesive feature to the package substrate, wherein a first top surface of the first adhesive feature is higher than a second top surface of the package component, and wherein the first adhesive feature is softer than both of the molding compound and the underfill; and placing a lid comprising an upper portion over the package component, wherein the lid contacts the first adhesive feature, and is attached to the package component through a thermal interface material.

17. The method of claim 16 further comprising dispensing a second adhesive feature on the package substrate, wherein the lid comprises a portion inserted into the second adhesive feature.

18. The method of claim 1, wherein the first adhesive feature is dispensed as a flowable adhesive, and wherein the flowable adhesive is in physical contact with the package component.

19. The method of claim 10, wherein the first adhesive feature is in physical contact with a top surface of the package component.

20. The method of claim 16, wherein the first adhesive feature is softer than both of the molding compound and the underfill.

\* \* \* \* \*